US008277672B2

(12) United States Patent
Makarov (10) Patent No.: US 8,277,672 B2
(45) Date of Patent: Oct. 2, 2012

(54) ENHANCED FOCUSED ION BEAM ETCHING OF DIELECTRICS AND SILICON

(75) Inventor: Vladimir V. Makarov, Fremont, CA (US)

(73) Assignee: Tiza Lab, LLC, Milpitas, CA (US)

( * ) Notice: Subject to any disclaimer, the term of this patent is extended or adjusted under 35 U.S.C. 154(b) by 396 days.

(21) Appl. No.: 12/426,027

(22) Filed: Apr. 17, 2009

(65) Prior Publication Data

US 2010/0264111 A1    Oct. 21, 2010

(51) Int. Cl.
*H01B 13/00*    (2006.01)
*G21G 5/00*    (2006.01)

(52) U.S. Cl. ............ 216/66; 216/13; 216/21; 250/492.3
(58) Field of Classification Search .................. 216/21
See application file for complete search history.

(56) References Cited

U.S. PATENT DOCUMENTS

| | | | |
|---|---|---|---|
| 5,110,407 A * | 5/1992 | Ono et al. ...................... 438/696 |
| 5,534,231 A * | 7/1996 | Savas ............................ 216/67 |
| 5,840,630 A | 11/1998 | Cecere et al. | |
| 6,211,527 B1 | 4/2001 | Chandler | |
| 6,268,608 B1 * | 7/2001 | Chandler .................... 250/492.2 |
| 6,635,185 B2 * | 10/2003 | Demmin et al. ................ 216/64 |
| 7,060,196 B2 | 6/2006 | Makarov et al. | |
| 2003/0215721 A1 | 11/2003 | Yang et al. | |
| 2005/0192193 A1 * | 9/2005 | Korzenski et al. ............ 510/175 |
| 2005/0227482 A1 | 10/2005 | Korzenski et al. | |
| 2006/0154188 A1 | 7/2006 | Hirayama et al. | |
| 2006/0284112 A1 * | 12/2006 | Tomimatsu et al. ....... 250/492.1 |
| 2007/0158304 A1 * | 7/2007 | Nasser-Ghodsi et al. ....... 216/66 |
| 2008/0113455 A1 | 5/2008 | Jain et al. | |

OTHER PUBLICATIONS

Paliakoff, S. Introduction to Supercritical Fluids [online], Jan. 2001 [Retrieved Oct. 27, 2011] Retrieved from the Internet <URL: http://www.nottingham.ac.uk/supercritical/scintro.html>.*
Ximen, H. et al., Halogen-based Selective FIB Milling for IC Probe-Point Creation & Repair; Proc. 20th Int'l Symp. for Testing and Failure Analysis, pp. 141-150, Nov. 13-18, 1994.
Abramo, M. et al, Gas Assisted Etching: An Advanced Technique for Focused Ion Beam Device Modification, Proc. 20th Int'l Symp. for Testing and Failure Analysis, pp. 439446, Nov. 13-18, 1994.
Bender, H., et al., Investigation on the Corrosion of Cu Metallization in the Focused Ion Beam System Due to a Low I2 Background, Proc. 25th Int'l Symp. for Testing and Failure Analysis, pp. 135-140, Nov. 14-18, 1999, Santa Clara, CA.

* cited by examiner

*Primary Examiner* — Duy Deo
*Assistant Examiner* — Bradford Gates
(74) *Attorney, Agent, or Firm* — Barry N. Young (57) ABSTRACT

Silicon, silicon dielectrics and low-k dielectrics are etched in a focused ion beam process using gaseous fluorinating etchants selected from the group of triethylamine trihydrofluoride (TEATHF) and xenon fluoride. Xenon fluoride is combined with a secondary protecting agent to avoid undesired corrosion of bare silicon. The protecting agent may be an oxidizing agent such as oxygen, perfluorotripentylamine (PFTPA), or a heavy completely fluorinated hydrocarbon.

8 Claims, 5 Drawing Sheets

ENHANCED FOCUSED ION BEAM ETCHING OF DIELECTRICS AND SILICON

BACKGROUND OF THE INVENTION

This invention relates generally to focused ion beam (FIB) etching processes, and more particularly to focused ion beam gas assisted etching (GAE) of silicon and dielectrics based on silicon in integrated circuits (IC).

Focused ion beam processes are widely used for debugging and verification of the functionality of integrated circuits (IC) and for IC circuit editing (CE) applications. Circuit editing involves the modification of individual IC circuits in order to correct design or manufacturing errors that cause IC malfunctions. FIB systems use a finely focused beam of gallium ions that can be operated in a wide range of beam currents from portions of pico-Amperes (pA) to tens of nano-Amperes (nA). Normally, the ion beam is scanned over an area of interest of a microchip producing emission of neutral or charged secondary particles. Neutral particles are mostly atoms and molecules sputtered from the scanned surfaces, and charged secondary particles are mostly secondary electrons and ions. Charged secondary particles are normally used in FIB instruments to form an image of the scanned area, so that its modification can be observed. The main purpose of FIB application for circuit editing (CE) is modification of the scanned area by either selective removal of specific materials (selective etching) or deposition of some specific materials, as, for example, having very low conductivity (insulators) or high conductivity (conductors). FIB systems provide for local "flooding" of a specimen with a variety of different gases. These gases can either interact with the primary gallium beam to provide selective gas assisted accelerated chemical etching or deposition of either conductive or insulating material by decomposition of the precursor gas by the primary ion beam.

As every IC structure comprises multiple layers of metal wiring interconnects and isolating materials (dielectrics), as well as bulk substrate semiconductor material, typically silicon (Si), CE modification typically involves some or all of four basic FIB processes. These are the selective etching of one or more dielectric layers to expose a metal line or circuit of interest, the selective etching of metal to cut an interconnecting line of interest, the deposition of a metal conductor material to connect lines of interest, and the deposition of an insulator material to isolate lines or circuits. Since CE typically involves milling trenches or vias through layers of densely interleaved layers of metals and dielectrics to reach an area of interest, to avoid damage or destruction of the IC it is important that these FIB processes, particularly the etching of dielectrics and metals, be carefully controlled to selectively etch only the target material of interest and to minimize damage to other materials and structures of the IC. It is also important to avoid re-deposition of sputtered material removed by etching onto adjacent trench walls and surfaces of the IC.

An ion beam itself is a destructive agent causing only erosion or sputtering of the exposed solid material of the IC. It is possible to obtain desirable results such as selective etching and deposition of different materials by directing to the target surface where an FIB operation is being performed gaseous precursors for conductor or insulator deposition, or gaseous chemicals for selective gas assisted etching (GAE) of the target material. These chemicals are adsorbed on the surface, and the ion beam activates surface reactions resulting in either deposition or etching of the materials in the area exposed to the ion beam. To obtain a desired pressure of a gaseous agent in the spot of FIB operation, FIB systems use a small nozzle positioned very close to the target surface exposed to the ion beam. The chemical agents are directed to the target spot through this nozzle. In general, the result of any FIB operation depends on the chemistry used and the ratio between chemical pressure and ion dose delivered to the target spot of the operation. FIB systems enable adjustment of local pressure of the chemical agent and ion beam current so that the FIB process produces desirable results with good efficiently.

Currently, xenon difluoride, $XeF_2$, is a widely used FIB dielectric etching agent for silicon dielectrics such as silicon dioxide, $SiO_2$, and silicon nitride, $Si_3N_4$. Almost all dielectrics used in IC manufacturing have silicon as one of their base elements. During FIB gas assisted dielectric etching using $XeF_2$, silicon is oxidized by fluorine to form silicon fluoride, $SiF_4$, which is a gas under normal conditions. This affords good efficiency and high selectivity when $XeF_2$ is used for etching dielectrics. Also, the gaseous by-products of the etching process are volatile and easily removed by the vacuum pumping system so that the etched material by-products are not re-deposited on the walls of etched holes and other neighboring surfaces. Since in most cases, etching of a dielectric is used to expose a metal copper or aluminum line, an important advantage of using the fluorinating chemical $XeF_2$ for dielectric etching is that fluorine does not damage copper or aluminum. In contrast to other heavier halogens such as chlorine, bromine and iodine, fluorine does not corrode aluminum and copper deeper than few surface monolayers, which allows opening these materials with minimal damage. The heavier halogens create aluminum compounds that have spongy structure and can sublime with high vapor pressure at room temperature. Thus, traditionally they were used as very fast etchants for aluminum. However, these halogens (except fluorine) corrode copper material deeply which makes them inapplicable for exposing copper. Therefore, the only reasonable option for etching dielectrics in ICs to expose metal lines has been to use a fluorinating agent (rather than halogenating agent) as an etchant, and $XeF_2$ has been used as a dielectric etchant in FIB applications for years.

However, new developments in ICs technology have made $XeF_2$ inapplicable as an etchant in a number of applications. Because of the increasing complexity and density of active elements in ICs, a significant portion of modern ICs employ so called "flip-chip" packaging where access to the top layers for CE must be obtained only through the transistor layer (or "active silicon") of the microchip. This means it is necessary to expose the active silicon to FIB chemistries during CE work. Additionally, new "organic" or low-k dielectrics are increasingly being used instead of traditional $SiO_2$, and there is an increasing tendency to employ a variety of other new dielectrics. $XeF_2$ is undesirable and problematic for flip-chip technology and these new materials.

Figure 1:
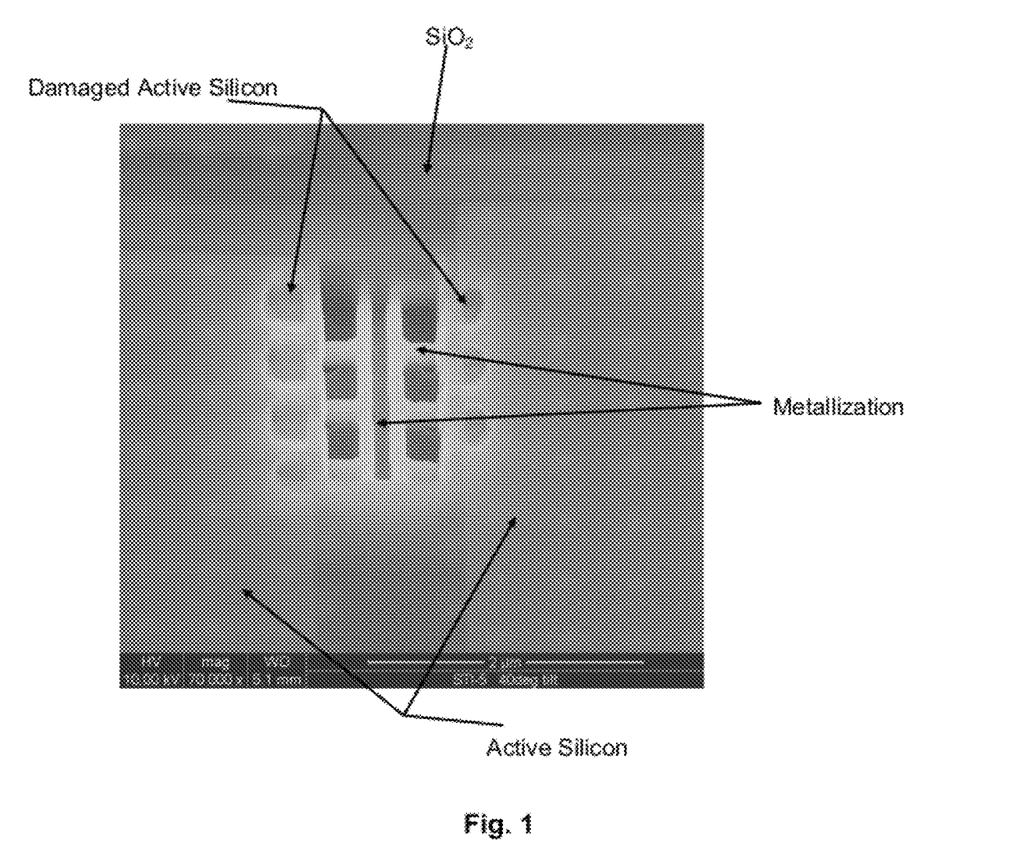
FIG. 1 is a microphotograph that illustrates the corrosion of bare active silicon adjacent to the open metallization in a flip chip packaged IC during FIB etching with $XeF_2$ to expose metal lines.

It is very well known that $XeF_2$ corrodes bare silicon, i.e., it spontaneously etches silicon without ion beam assistance. This creates significant difficulties in "back-side" CE operations on flip-chip packaged ICs where active (bare) silicon is exposed, which is inevitable when doing "back-side" circuit edit operations. FIG. 1 illustrates the corrosion and damage of active silicon adjacent to the open metallization in a flip chip packaged IC during FIB etching with $XeF_2$ to expose the metal lines. The vulnerability of bare silicon to $XeF_2$ corrosion requires the application of protective coatings to the silicon prior to $XeF_2$ application. This makes CE operations longer and more complex.

Figure 2:
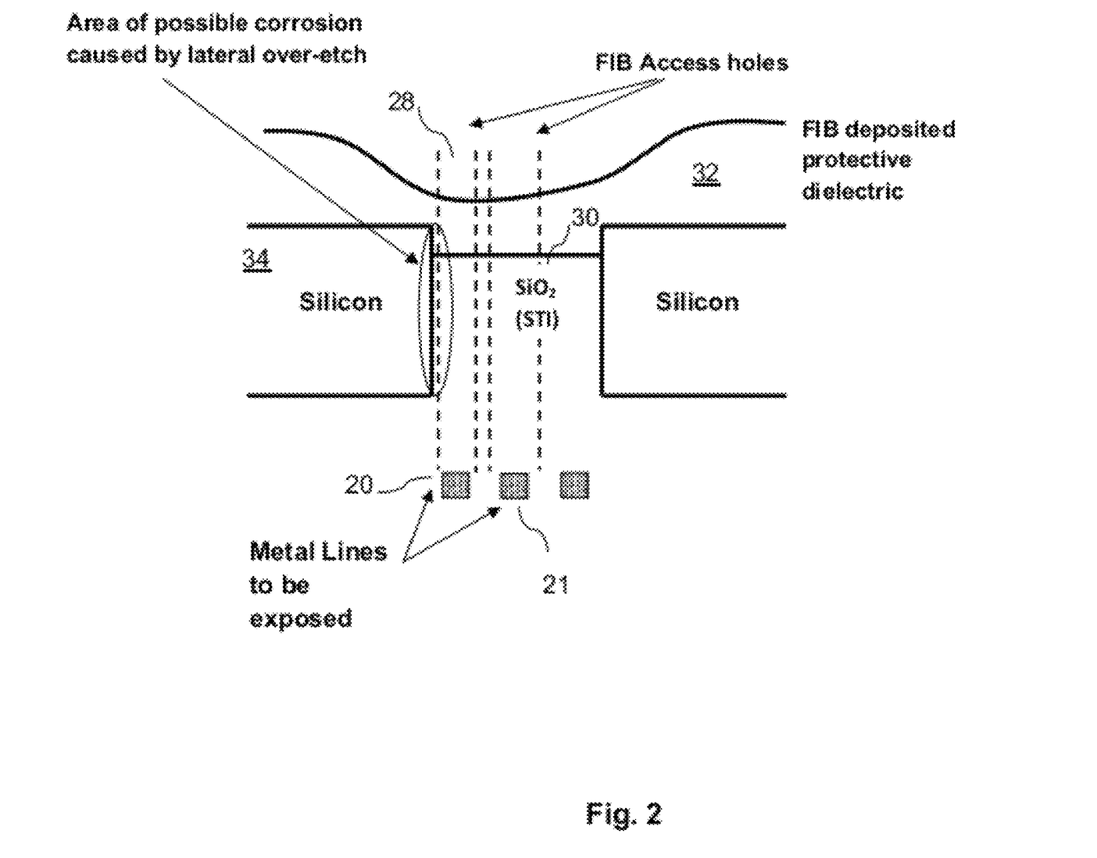
FIG. 2 is a diagrammatic view that illustrates the corrosion of active silicon closely adjacent to a trench etched by $XeF_2$ to access metal lines buried beneath an $SiO_2$ isolation layer between two areas of silicon.
Figure 3:
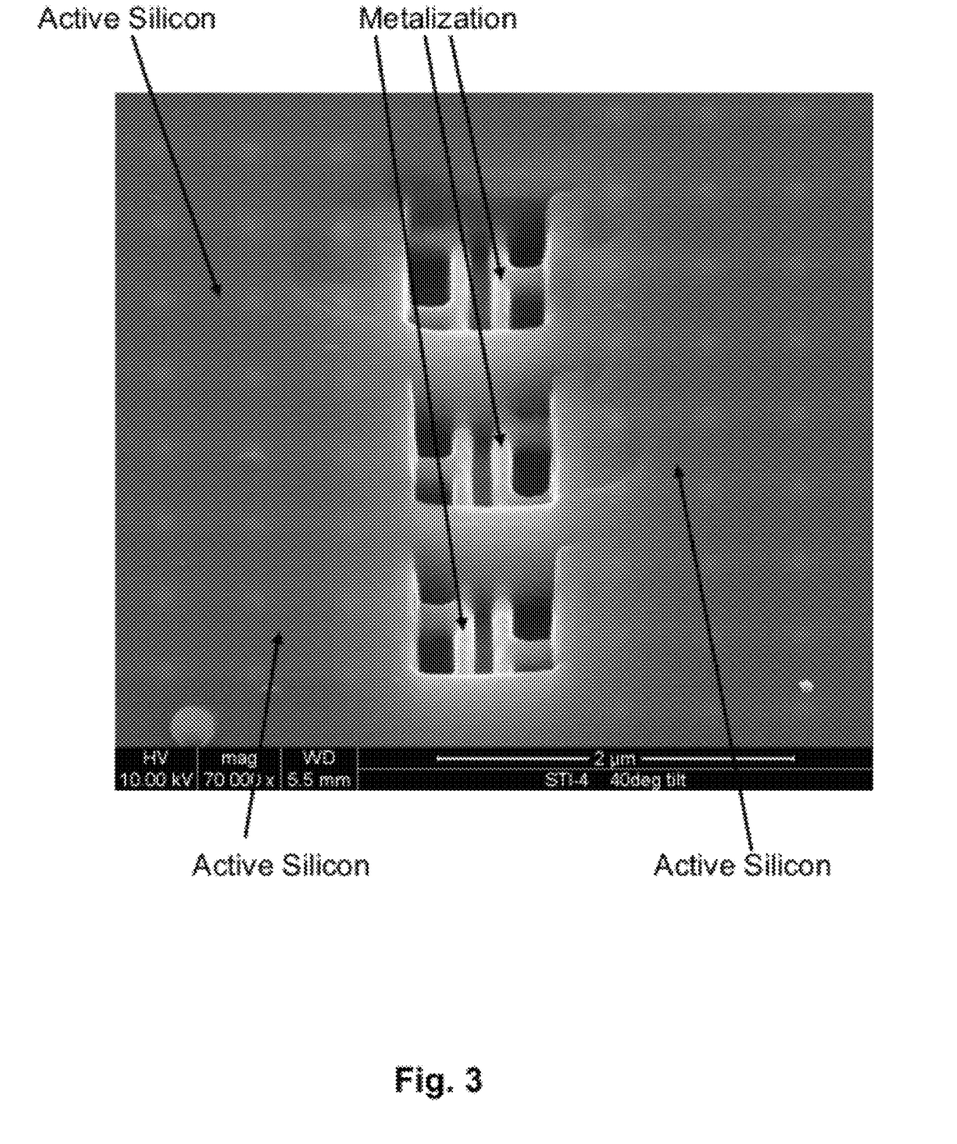
FIG. 3 is a microphotograph which shows an example of minimal or no damage to active silicon in an FIB etching process using $XeF_2$ in combination with a perfluorotripentylamine (PFTPA) protecting agent in accordance with the invention to open copper lines.

In the case of dense active circuit elements in an IC, where FIB operation has to be performed very close to active silicon, the protective coatings can protect silicon from the top only, but not against natural lateral over-etch. This is illustrated in FIG. 2, which is a diagrammatic transverse view illustrating FIB etching of access holes through a silicon dioxide ($SiO_2$) shallow trench isolation (STI) layer of an IC to gain access to metal lines 20, 21. As shown, to gain access to line 20, the FIB access hole 28 must penetrate an FIB deposited protective dielectric 32 and pass through the $SiO_2$ layer 30 closely adjacent to silicon 34. This exposes the adjacent silicon area to lateral over-etch, by $XeF_2$ as shown at 38. The protective dielectric 32 deposited over the silicon areas may protect the silicon against $XeF_2$ corrosion from the top, but it does not protect it from lateral over-etching at the vertical (in the figure) sidewalls of the access hole.

Furthermore, it has been reported that some types of the new organic dielectrics show signs of corrosion under exposure to $XeF_2$ similar to those observed on silicon. This means that use of $XeF_2$ as a dielectric etchant is problematic not only for back-side CE applications, but also for front-side applications.

It is desirable to afford FIB process etch-assisting chemical compounds that address the foregoing and other problems of known dielectric etchants, that are non-corrosive to metals used for interconnects in ICs and have other desirable properties, and which will react with a solid specimen to produce volatile by-products that can be removed easily from the FIB vacuum chamber so that they are not re-deposited upon the specimen or neighboring surfaces. It is to these ends that the present invention is directed.

SUMMARY OF THE INVENTION

In accordance with the invention, a FIB etching process is provided for silicon and IC dielectrics, including those containing silicon (Si), carbon (C), fluorine (F), oxygen (O), nitrogen (N) and even hydrogen (H), using chemistries that produce easily removed gaseous by-products, that afford close control over the etching process, and that avoid unwanted damage to bare silicon. Since fluorine, oxygen, nitrogen and hydrogen are gases, the FIB etchants of the invention produce volatile gaseous by-products with Si and C that are easily removed by the vacuum chamber pump to provide clean etching of the target material of interest and do not re-deposit by-products on the neighboring surfaces.

In accordance with one aspect, the invention affords a method of etching and an organic fluorinating reagent triethylamine trihydrofluoride (TEATHF) as an etch assisting agent in a FIB process for etching silicon, silicon dielectrics, and low-k dielectrics.

In yet another aspect, the invention affords a method of etching silicon, silicon dielectrics and low-k dielectrics using xenon difluoride, $XeF_2$, in combination with a secondary gaseous protecting agent that is chemically neutral (non-reactive) to $XeF_2$ and selected from the group of compounds consisting of oxygen, perfluorotripentylamine (PFTPA), and heavy completely fluorinated hydrocarbons and amines in a sufficient concentration to prevent corrosion of silicon.

DESCRIPTION OF PREFERRED EMBODIMENTS

The invention is particularly well adapted to the gas assisted focused ion beam etching of silicon semiconductor materials and dielectrics for circuit editing of integrated circuits, and will be described in that context. It will be appreciated, however, that this is illustrative of only one utility of the invention and that the invention has greater applicability to other applications and to other types of materials.

Focused ion beam (FIB) systems that are useful for CE and gas assisted etching of dielectrics and semiconductor materials are well known and will not be described in detail herein. Examples of such FIB systems for gas assisted etching processes that may be used to practice the invention are shown in U.S. Pat. No. 5,840,630 to Cecere et. al and U.S. Pat. No. 6,211,527 to Chandler, the disclosures of which are incorporated by reference herein.

As is well known, and as is shown in these referenced patents, an FIB instrument comprises a vacuum chamber with a holder for a specimen such as a microchip to be modified by the FIB process, an ion column, a gas delivery system (GDS) comprising a gas nozzle which can be positioned close to the microchip surface for delivering chemical etchants or precursors to a small localized target area on the microchip surface at adjustable pressure, and a system for scanning the ion beam over the microchip surface. Normally the nozzle to surface distance is between about 0.1 mm and 1 mm, and a navigation system allows precise positioning of the microchip with respect to the ion beam or vice versa. The specimen, e.g., the microchip which is to be processed, is installed in the vacuum chamber in such a way that it can be exposed to the gallium ions, $Ga^+$, at selected ion beam potentials of the order of 25-50 kV out of the ion column, and also concurrently exposed to a chemical etchant/precursor gas stream from the gas nozzle of the GDS.

The ion beam current may be adjusted over a wide operating range, normally to a value within a range that is of the order of about 1 pico-Amperes (pA) or below to several tens of nano-Amperes (nA). The gas pressure in the localized area of interest is typically on the order of 0.05-1 torr, and is linearly correlated with pressure in the vacuum chamber with a coefficient of the order of $\sim 10^{-4}$. The base pressure in the chamber for no gas delivery is of the order of $10^{-7}$ to $10^{-6}$ torr, but when the gas is on, the pressure becomes about $0.5 \times 10^{-5}$ to $10^{-4}$ torr. Pressures higher than about 6 to $10 \times 10^{-5}$ torr are undesirable because this can result in damage to the ion column. Normally, the ion column has its own vacuum pumping system which affords external pressures of a maximum of about $10^{-4}$ torr. Otherwise, an automatic protection mechanism in the FIB system may close the column with a special gate.

FIB systems also incorporate an imaging system similar to that of a scanning electron microscope (SEM) for in situ process control. The imaging system may utilize secondary particle, e.g., secondary electron or secondary ion, emission caused by ion beam interaction with the exposed surface of the specimen to create an image of the target area.

During a FIB process, high energy ions that come into contact with the surface of the solid material of the specimen penetrate to deeper layers of the solid, creating cascades of atomic collisions. These collisions may produce many generations of secondary recoils with decreasing energies as the number of the collisions increases. The higher the number of the collision, the more random the recoil motion direction is, with higher generations moving more isotropically. A significant part of these recoils returns to the surface of the solid causing sputtering and/or vibrational excitation of surface atoms. The excitation energy is on the order of a few electron-volts (eV), which is in the range of the activation energy of most chemical reactions. Therefore, if an absorbed chemical compound is present on the surface of the solid, an ion beam assisted chemical reaction can occur between atoms of the solid and the adsorbed chemical compound molecules of the gas.

Xenon difluoride, $XeF_2$, is a fluorinating agent and an efficient etchant in a gas-assisted FIB process of silicon dielectrics, such as silicon dioxide, $SiO_2$, and silicon nitride, $Si_3N_4$, and of low-k dielectrics. As used herein, low-k dielectrics means dielectrics containing one or more of the elements silicon (Si), carbon (C), fluorine (F), oxygen (O), nitrogen (N) and hydrogen (H), and dielectrics containing fluorine doped silicon dioxide, carbon doped silicon dioxide, porous silicon dioxide, porous carbon doped silicon dioxide, silicone based polymeric dielectrics including hydrogen silsesquioxane (HSQ) and methylsilsesquioxane (MSQ), and polyimide. Low-k dielectrics containing such elements are readily etched by a fluorinating agent, such as $XeF_2$, in the presence of an ion beam. $XeF_2$ also is an active etchant of silicon, Si. $XeF_2$ reacts with $SiO_2$ and Si in the presence of an ion beam as follows:

$SiO_2 + 2XeF_2$ (beam assisted) $= SiF_4$ (gas) $+ O_2$ (gas) $+ Xe$ (gas)

$Si + 2XeF_2$ (beam assisted) $= SiF_4$ (gas) $+ Xe$ (gas)

As shown, the by-products of the reactions are gaseous. Thus, they are easily removed by the vacuum system of the FIB, and re-deposition onto the solid specimen of etched material by-products is avoided. The presence in the specimen of carbon, or the other elements in the dielectrics described above which produce gaseous by-products, would not materially change the reaction. Carbon reacts with $XeF_2$ to create $CF_4$ which is also a gas, as are fluorine, nitrogen and hydrogen. Thus, carbon would behave as additional silicon in the specimen and would be volatized in the same way.

However, as described above, $XeF_2$ has the disadvantage that this compound reacts spontaneously with bare silicon without any assistance of an ion beam, and leads to aggressive and uncontrolled etching of the silicon. As a result, when using $XeF_2$ for CE on a microchip, very careful control is required to avoid exposure of so-called "active silicon" of the microchip, i.e., the silicon structures that form transistors and other functional elements of the device. If during the etching, some active silicon is exposed, it may be spontaneously corroded by $XeF_2$ causing damage to the microchip functionality, which is undesirable and may have negative consequences for the whole FIB circuit edit operation. This is illustrated in FIG. 1 which shows an example of damage to active silicon caused by $XeF_2$ in a conventional FIB etching process to open copper lines.

However, In accordance with the invention, it has been found that this disadvantage of $XeF_2$ may be overcome to avoid the corrosion of silicon by using $XeF_2$ in combination with one or more secondary protective agents that are non-reactive with $XeF_2$ and that protect Si, as will be described below.

In a preferred embodiment, the invention uses a newly discovered organic fluorinating reagent that has been found to be very effective and performs exceptionally well as an etchant in a gas assisted FIB processes for accelerating the etching of silicon and dielectrics, including silicon dielectrics and low-k dielectrics, but which does not spontaneously attack bare silicon. This organic fluorinating compound has desirable properties and avoids the problems with other known etchants, such as $XeF_2$ which corrodes silicon when used alone without a protecting agent, as will be described.

Figure 4:
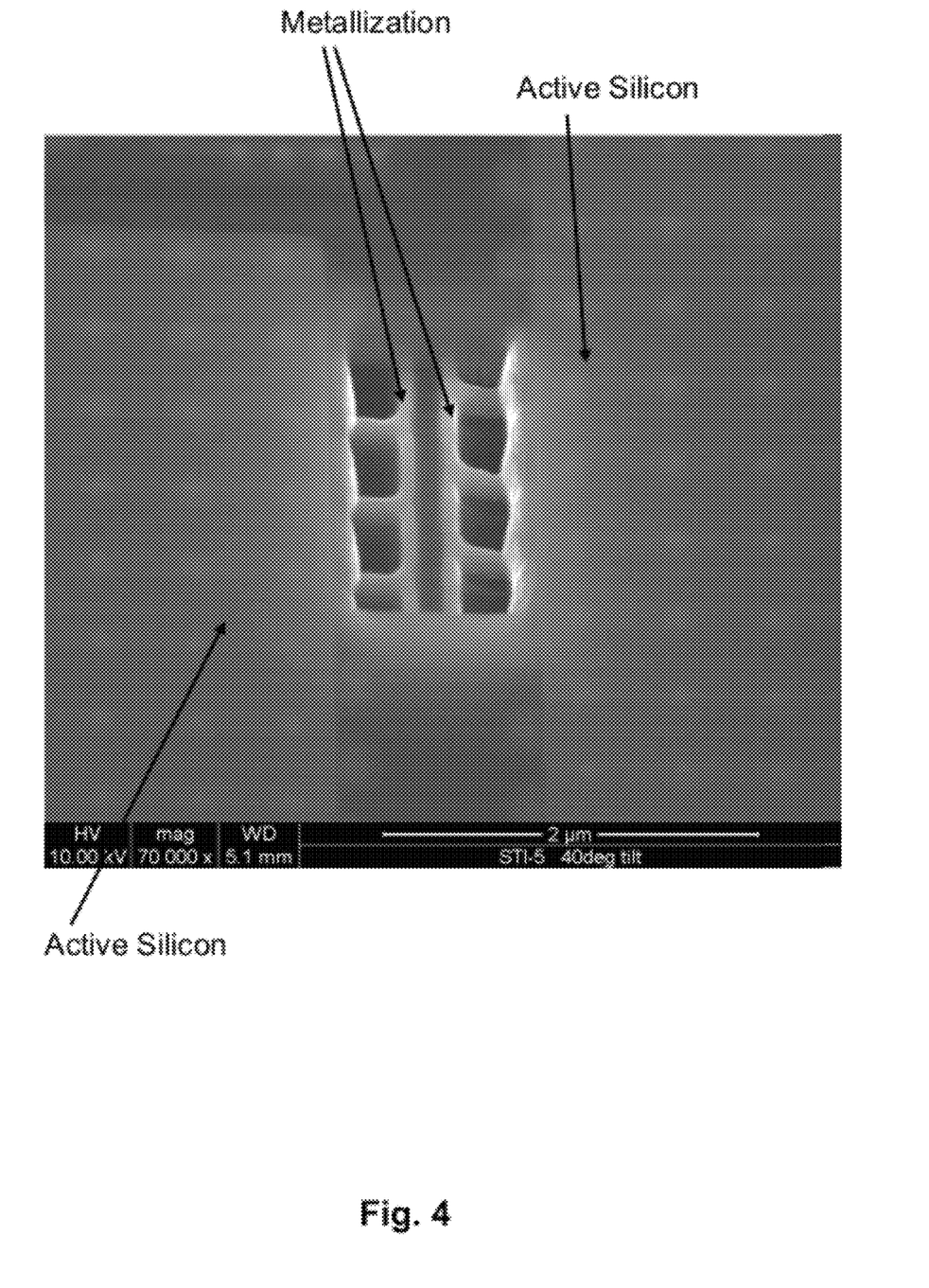
FIG. 4 is a microphotograph that illustrates the absence of damage to active silicon in a FIB etching process using TEATHF in accordance with the invention to open copper lines in an IC.

In accordance with the invention, the preferred compound which has been found that meets the above requirements is the organic fluorinating reagent triethylamine trihydrofluoride (TEATHF). This organic fluorinating compound has the molecular formula $N(Et)_3 \cdot 3HF$, where Et is the ethyl radical $C_2H_5$. It has been experimentally confirmed that TEATHF, used alone without other agents, reacts to etch silicon and low-k dielectrics in a FIB process to produce gaseous products without damaging bare silicon. FIG. 4 illustrates the results of a FIB etching process using TEATHF to open copper lines in a silicon IC which uses $SiO_2$ as a dielectric. As shown in the figure, the metallization layer is nicely opened and exposed without damage to the active silicon. An equation of that characterizes this reaction and that produces volatile gaseous by-products is as follows:

$3SiO_2 + 4[(N(Et)_3) \cdot 3HF]$ (beam assisted) $= 6H_2O$ (gas) $+ 3SiF_4$ (gas) $+ 4N(Et)_3$ (gas)

The gaseous by-products of the process are easily handled, and are readily removed by pumping of the vacuum chamber, which avoids the deleterious effects of secondary re-deposition.

It has been found experimentally that $(N(Et)_3) \cdot 3HF$ advantageously does not react spontaneously (without an ion beam) with bare Si, as does $XeF_2$, thus avoiding damage to the active silicon of an IC. Accordingly, TEATHF may be used as an etchant alone without other protective gases or agents. As a result, TEATHF affords good process control for dielectric etching without the danger of damaging the Si substrate of the specimen. TEATHF, while toxic, is stable, not exceptionally difficult to handle, and is readily available commercially. Working examples of using TEATHF as an etchant in a focused ion beam process are given below in Table 2.

It should be noted that TEATHF is not a fluorinated hydrocarbon, which is the class of compounds disclosed by the referenced Chandler patent as etchants for a FIB process. The formula $N(Et)_3 \cdot 3HF$ of TEATHF means that three HF molecules are connected to the $N(Et)_3$ molecule by so-called hydrogen bonds which are electrostatic attraction bonds rather than chemical bonds. Both hydrofluoric acid (HF) and tributylamine ($N(Et)_3$) exist as individual chemicals. In contrast, fluorinated hydrocarbons are those where some or all hydrogen atoms are replaced with fluorine atoms, such as, for instance, trifluoroacetic acid, $CF_3COOH$ (as compared to acetic acid, $CH_3COOH$) and trifluoroacetamide, $CF_3CONH_2$ (as compared to acetamide, $CH_3CONH_2$).

As described above, $XeF_2$ is a very powerful and well known fluorinating agent that has advantages as an FIB etchant, in spite of its ability to spontaneously attack bare silicon. Thus, $XeF_2$ is attractive as an etchant if corrosion of bare silicon can be avoided. In accordance with the invention, it has been found that this disadvantage of $XeF_2$ can be avoided by combining $XeF_2$ with one of several protective agents that have been found to protect bare silicon from spontaneous corrosion by $XeF_2$. As will be described shortly, these protective agents comprise oxygen and certain heavy completely fluorinated hydrocarbons.

In accordance with an embodiment of the invention, oxygen may be used in combination with $XeF_2$ as a protective agent. Since silicon dioxide, $SiO_2$, is not vulnerable to spontaneous corrosion from $XeF_2$, by applying oxygen as a secondary gas along with $XeF_2$, the oxygen oxidizes Si to form a protective layer of $SiO_2$ over the silicon, thereby permitting control of the FIB etching process using $XeF_2$.

By applying ion beam irradiation to a target area of interest in bare silicon along with a flux of oxygen, the oxygen creates a thin layer of $SiO_2$ over the exposed silicon protecting it against corrosion during FIB etching using $XeF_2$. Importantly, oxygen does not react chemically with $XeF_2$. Therefore, the flux of oxygen may be delivered simultaneously with $XeF_2$ from either the same gas nozzle or from a separate gas supply nozzle in the FIB system, and the oxygen supply may be adjusted independently to afford a flux sufficient to protect against spontaneous corrosion during the etching operation.

As the material exposed to the ion beam in this case represents a mixture of Si and $SiO_2$, the chemical reaction of the etching process can be expressed as a combination of following equations:

$SiO_2+2XeF_2$ (beam assisted)=$SiF_4$ (gas)+$O_2$ (gas)+Xe (gas)

$Si+2XeF_2$ (beam assisted)=$SiF_4$ (gas)+Xe (gas)

Outside of the etched area, the spontaneous corrosion is significantly inhibited by a thin layer of initially created $SiO_2$ as well as by reduced adsorption of $XeF_2$ in the presence of $O_2$ adsorption. Table 3, below, gives several working examples of process parameters that have been found to be effective and that afford good results.

In accordance with another embodiment of the invention, another protective compound that has been found to be effective in preventing corrosion of Si by $XeF_2$ when used as a secondary component with $XeF_2$ in FIB etching is perfluorotripentylamine (PFTPA), which has the molecular formula $N[CF_3(CF_2)_4]3$. Importantly, PFTPA as a completely fluorinated compound does not react chemically with $XeF_2$. Therefore, the flux of PFTPA may be delivered simultaneously with $XeF_2$ from either the same or from a separate gas supply nozzle in the FIB system, and the PFTPA supply may be independently adjusted to a flux sufficient to protect against spontaneous corrosion during the etching operation.

When using a combination of $XeF_2$ and PFTPA for etching $SiO_2$, one can neglect the reactivity of the PFTPA with $SiO_2$ as compared to the reactivity of $XeF_2$. Therefore, the reaction in the area of the beam scanning will be substantially the same as if $XeF_2$ were present alone. The following equation characterizes the reaction of $XeF_2$ and $SiO_2$:

$SiO_2+2XeF_2$ (beam assisted)=$SiF_4$ (gas)+$O_2$ (gas)+Xe (gas)

There will be some decrease in the etching rate caused by the competing adsorption of PFTPA. But outside of the scanning area, PFTPA will significantly inhibit corrosion of the exposed silicon by the following described mechanism.

The dynamics of gas collection on the surface of a solid can be described by the following (simplified) formula:

$C(t)=F \cdot \tau[1-\exp(-t/\tau)]$, where C(t) is the amount of the gas present on the surface at an elapsed time, t, after the gas was turned on or all the gas was removed (desorbed) from the surface, for instance, by the ion beam, as explained below. F is the gas flux which is proportional to the gas pressure, and τ is the residence time of the gas molecules on the surface, i.e., the average time the molecules sit on the surface before evaporation. The population of the gas molecules on the surface is proportional to the product of gas flux and residence time. Thus, even at low pressure, the amount of a gas, i.e., the population of gas molecules, on the surface can be very high if the residence time is long enough.

Although PFTPA is volatile, it is a heavy compound, and its vapor pressure under normal conditions is about forty times (40×) lower than that of $XeF_2$. This means that if both of the gases PFTPA and $XeF_2$ arrive at a surface with equal fluxes, after a long enough time the spot of gas incidence will be populated with PFTPA molecules about 40 times greater than with $XeF_2$ because of much longer residence time of PFTPA on the surface. Therefore, PFTPA will afford dynamic protection of the active silicon surface by blocking adsorption of $XeF_2$.

Furthermore, even reducing the gas flux of PFTPA by, for example, eight times, will still leave PFTPA as the dominate adsorbent at about five times greater than $XeF_2$. However, this occurs only where these adsorbents are competing with each other without interruption. In the spot of incidence where the scanning ion beam is etching silicon, the dynamics of the adsorbing processes will not be defined by the residence times of the adsorbents. Rather, the ion beam will be desorbing these adsorbents each time it completes a scan frame. If the scan frame time is shorter than the shortest residence time of the two gases, the ratio of gas populations at the scanned surface will be defined by the two gas fluxes, not by the gas residence times. Accordingly, if the gas flux ratio of $XeF_2$ to PFTPA is eight to one (8:1), then in the scanning area $XeF_2$ will dominate over PFTPA by a factor of eight times (8×), while outside of the scanning area PFTPA will be dominating, but by a factor of 5× because of the advantage of its greater residence time (40:1). The invention utilizes this advantage to protect active silicon outside of the scanned area from spontaneous corrosion by $XeF_2$, as described below.

Figure 5:
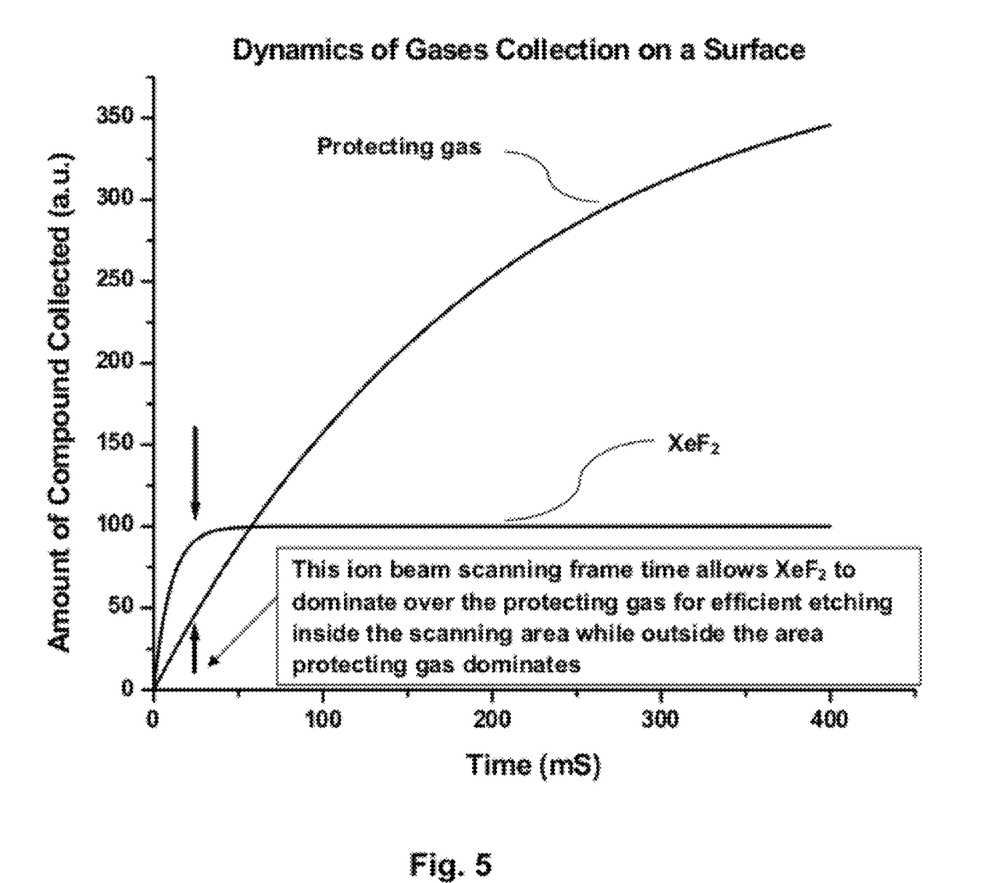
FIG. 5 is a diagrammatic view that illustrates the mechanism of the invention in protecting silicon against corrosion by using a combination of $XeF_2$ and a protecting gaseous compound having a longer residence time than $XeF_2$ on the silicon surface.

FIG. 5 shows curves of the differences in the amount of $XeF_2$, a high vapor pressure, low residence time compound, collected on a surface as a function of time, and the amount of low pressure, long resident time protective agent PFTPA collected on the surface due to different in adsorption characteristics. As can be seen from the two curves for high pressure and low residence time $XeF_2$ and low pressure but very long residence time for PFTPA, if nothing disturbs the gases collected on the surface, then PFTPA dominates over $XeF_2$ at longer elapsed times. Thus, if the scanning ion beam has a frame rate selected such that it revisits each spot of the scanned area after a relatively short frame time as shown by the two arrows (approximately 20-30 milliseconds (mS) in the figure), then the ion beam sees a surface where $XeF_2$ dominates over PFTPA. Accordingly, gas assisted etching occurs substantially as if $XeF_2$ was present alone in the scanned spot. At the start of the next frame, the collection process is restarted. However, the large number of PFTPA molecules collected on the surface outside of the scan area is not desorbed by the ion beam and the molecules continue to build up, and must be applied at much lower pressure. With appropriate process parameters, the amounts of the compounds collection on silicon surface would go the way shown by the curves in the figure. Thus, by adjustment of the ion beam scanning time, the FIB process can ensure that the etching efficiency in the area of the beam scanning would be sufficiently high to accomplish efficient etching in spite of the presence of the protecting gas, while protecting the areas of the silicon outside of the scanning area. Thus, the secondary protective gas is effective to protect the adjacent bare Si areas from spontaneous corrosion by $XeF_2$. This method of adsorption control afforded by the invention advantageously and simply solves the problem of spontaneous etching of silicon to protect areas where the ion beam does not scan the surface.

PFTPA which is a preferable protective agent for use with $XeF_2$ is representative of a larger group of heavy chemicals which may be used in combination with $XeF_2$ to protect silicon from spontaneous corrosion. This group of compounds may be defined as:

1. Completely fluorinated hydrocarbons selected from the group of:
   a) completely fluorinated alkanes having the general formula $C_nF_{2n+2}$;
   b) completely fluorinated alkynes having the general formula $C_nF_{2n-2}$;
   c) completely fluorinated alkenes having the general formula $C_nF_{2n}$; and
   d) combinations of the above, where the number of carbon atoms is greater than or equal to ten, i.e., $n \geq 10$; or 2. Completely fluorinated amines having the general formula $NR_3$, where R is a radical and a derivative of the above completely fluorinated hydrocarbons with the formulas $C_nF_{2n+1}$, $C_nF_{2n-3}$, or $C_nF_{2n-1}$ or combination of these, and with $n \geq 4$.

As these compounds are completely fluorinated, they cannot be further fluorinated; thus they will not react with $XeF_2$, which would inhibit or destroy its effectiveness as an etchant. The large numbers of elements in their fluorinated chains makes these compounds heavy and will provide high "stickiness" to surfaces which corresponds to long residence times.

In general, in a FIB process, efficiency, feasibility and productivity are defined by the ratio of the ion beam current density and etchant/precursor gas flux during a FIB gas assisted process. Current density by definition is the dose of ions delivered by the beam each second per square micron of the scanned area. Current density (in FIB practice) is normally measured in pico-Amperes per square micron (pA/$\mu m^2$). Gas flux is assumed to be proportional to the gas pressure in the working chamber during the operation. Normally this pressure is adjusted to a preliminary recommended value by mass flow control valves or by controlling the temperature of the crucibles containing the compounds from which the gas is evaporated and delivered to the gas delivery system. All of the other parameters that can affect gas flux in the working spot, such as, for instance, gas nozzle positioning, may be standard values for conventional FIB processes. Accordingly, if the gas pressure is reasonably close to a recommended value, the only parameter that is important for the gas operation quality is the beam current density.

Preferred FIB process parameters for a FIB process in accordance with the invention which are applicable to the organic fluorinating reagent etchant TEATF as well as to the fluorinating etchant agent $XeF_2$ in combination with protecting gases such as oxygen and heavy completely fluorinated compounds as defined above may be as follows.

The gallium ions, $Ga^+$, ion beam potentials are preferably adjusted to about 30 kV out of the ion column. The ion beam current is preferably adjusted to a value within the range of the order of about 1 pico-Amperes (pA) or below to several tens of nano-Amperes (nA) so that ion beam current density would be in the range of the preferred values for each etchant and/or combination of etchants as defined below. The preferred gas pressures and current densities are listed in the following Table 1, which gives specific preferred FIB process parameters for the etchants of the invention:

TABLE 1

| Primary Chemistry | Secondary Chemistry | Preferred pressure of Primary Chemistry (torr) | Preferred pressure of Secondary Chemistry (torr) | Preferred Ion Beam Current Density for Dielectric Etching (pA/$\mu m^2$) |
|---|---|---|---|---|
| TEATHF | None | $1.0 \times 10^{-5}$ | N/A | 3.0 |
| $XeF_2$ | PFTPA | $3.0 \times 10^{-5}$ | $5.0 \times 10^{-6}$ | 5.0 |
| $XeF_2$ | $O_2$ | $3.0 \times 10^{-5}$ | $1.0 \times 10^{-5}$ | 5.0 |

The parameters in Table 1 are only for the invention. They are related to the preferred chemicals and combinations of chemicals described. The values of the preferred parameters in Table 1 may vary and assume values within the range of ±30% of the preferred values shown. Time is a parameter that will depend upon the thicknesses of the etched layers.

The following Tables 2-4 are, respectively, working examples for TEATHF, and for $XeF_2$ in combination with the secondary protecting agents oxygen and PFTPA. The Tables give different sets of parameter values that have been found useful and that produce good results for the different chemistries of the invention.

TABLE 2

Working Examples - TEATHF

| Primary Etching Chemistry/ Pressure (torr) | Secondary Chemistry/ Pressure (torr) | Etched area size, (um × um) | Ion Beam Current, (pA) | Current Density (pA/um$^2$) | Etched Material/ Thickness (um) | Etching time min:sec |
|---|---|---|---|---|---|---|
| TEATHF/ 7.0E−6 | None | 2 × 1 | 5 | 2.5 | $SiO_2$/1.0 | 3:25 |
| TEATHF/ 6.7E−6 | None | 0.8 × 0.8 | 2 | 3.1 | $SiO_2$/1.0 | 3:40 |
| TEATHF/ 8.0E−6 | None | 1 × 1 | 3 | 3.0 | Si/1.0 | 2:40 |

TABLE 3

Working Examples - XeF$_2$ and Oxygen (O$_2$)

| Primary Etching Chemistry/ Pressure (torr) | Secondary Chemistry/ Pressure (torr) | Etched area size, (um × um) | Ion Beam Current, (pA) | Current Density (pA/um$^2$) | Etched Material/ Thickness (um) | Etching time min:sec |
|---|---|---|---|---|---|---|
| XeF$_2$/2.5E−6 | O$_2$/1.0E−5 | 2 × 1 | 10 | 5.0 | SiO$_2$/1.0 | 1:49 |
| XeF$_2$/2.2E−6 | O$_2$/1.1E−5 | 3 × 3 | 50 | 5.6 | Si/5.0 | 12:46 |
| XeF$_2$/2.7E−6 | O$_2$/1.0E−5 | 16 × 16 | 1056 | 4.13 | Si/10.0 | 22:35 |

TABLE 4

Working Examples - XeF$_2$ and PFTPA

| Primary Etching Chemistry/ Pressure (torr) | Secondary Chemistry/ Pressure (torr) | Etched area size, (um × um) | Ion Beam Current, (pA) | Current Density (pA/um$^2$) | Etched Material/ Thickness (um) | Etching time min:sec |
|---|---|---|---|---|---|---|
| XeF$_2$/2.4E−6 | PFTPA/5.0E−6 | 3 × 3 | 50 | 5.6 | SiO$_2$/1.0 | 3:19 |
| XeF$_2$/2.6E−6 | PFTPA/4.3E−6 | 0.8 × 0.8 | 3 | 4.69 | SiO$_2$/1.0 | 3:52 |
| XeF$_2$/2.6E−6 | PFTPA/4.8E−6 | 1 × 1 | 5 | 5.0 | Si/1.0 | 3:40 |

While the foregoing has been with reference to certain preferred embodiments of the invention, it will be appreciated that changes may be made to these embodiments without departing from the principles and the spirit of the invention, the scope of which is defined by the appended claims.

The invention claimed is:

1. A method of etching a specimen containing silicon and a dielectric, comprising placing the specimen in a vacuum chamber; directing a gas containing molecules of triethylamine trihydrofluoride (TEATHF) to a localized area of the specimen; and directing a focused ion beam to the localized area to activate said TEATHF in said localized area to etch material from the specimen.

2. The method of claim 1, wherein said dielectric comprises a dielectric selected from the group consisting of silicon dioxide, silicon nitride, and low-k dielectrics containing elements selected from the group consisting of silicon, carbon, fluorine, oxygen, nitrogen, hydrogen and combinations thereof.

3. The method of claim 2, wherein said low-k dielectric is a dielectric selected from the group consisting of fluorine doped silicon dioxide, carbon doped silicon dioxide, porous silicon dioxide, porous carbon doped silicon dioxide, polyimide, and silicone based polymeric dielectrics selected from the group consisting of hydrogen silsesquioxane (HSQ) and methylsilsesquioxane (MSQ).

4. The method of claim 1, wherein said focused ion beam is scanned over said specimen at an average current density of between about 0.1 pA/μm$^2$ and 10 pA/μm$^2$.

5. The method of claim 4, wherein said focused ion beam is scanned over said specimen at an average current density of between about 1.0 pA/μm$^2$ and 8.0 pA/μm$^2$.

6. The method of claim 5, wherein said ion current beam density is of the order of 2.5 pA/μm$^2$ to 3.0 pA/μm$^2$.

7. The method of claim 1, wherein said TEATHF is supplied to provide a chamber pressure of between about 6.7×10$^{-6}$ torr and 8.0×10$^{-6}$ torr.

8. The method of claim 1, wherein said specimen is an integrated circuit, and said etching is performed for circuit editing.

* * * * *